United States Patent [19]

Hawker et al.

[11] Patent Number: 5,767,014

[45] Date of Patent: Jun. 16, 1998

[54] INTEGRATED CIRCUIT AND PROCESS FOR ITS MANUFACTURE

[75] Inventors: Craig Jon Hawker, Los Gatos; James Lupton Hedrick, Pleasanton; Robert Dennis Miller, San Jose, all of Calif.

[73] Assignee: International Business Machines Corporation, Armonk, N.Y.

[21] Appl. No.: 739,133

[22] Filed: Oct. 28, 1996

[51] Int. Cl.$^6$ .................................. H01L 21/28
[52] U.S. Cl. .................. 438/623; 438/633; 438/781; 438/790
[58] Field of Search .................... 438/623, 624, 438/633, 626, 630, 781, 790

[56] References Cited

U.S. PATENT DOCUMENTS

| | | | |
|---|---|---|---|
| 3,732,181 | 5/1973 | Ray et al. | |
| 4,001,870 | 1/1977 | Saiki et al. | 438/623 |
| 4,141,877 | 2/1979 | Luttinger et al. | 260/37 EP |
| 4,535,099 | 8/1985 | Lee et al. | 521/154 |
| 4,801,507 | 1/1989 | Estes et al. | 438/623 |
| 5,036,145 | 7/1991 | Echterling et al. | 525/431 |
| 5,043,369 | 8/1991 | Bahn et al. | 523/466 |
| 5,206,337 | 4/1993 | Takeda et al. | 528/313 |
| 5,252,654 | 10/1993 | David et al. | 524/414 |
| 5,288,842 | 2/1994 | Feger et al. | 528/335 |
| 5,384,376 | 1/1995 | Tunney et al. | 525/431 |
| 5,412,016 | 5/1995 | Sharp | 524/430 |
| 5,506,177 | 4/1996 | Kishimoto et al. | 436/624 |

OTHER PUBLICATIONS

Y. Chujo et al., "Organic Polymer Hybrids with Silica Gel Formed by Means of the Sol–Gel Method", Macromolecules: Synthesis, Order and Advanced Properties, Advances in Polymer Science, vol. 100, 1992.

J. M. Frechet et al., "Synthesis and Properties of Dendrimers and Hyperbranched Polymers", Comprehensive Polymer Science, Second Supplement, 1996.

S. Srinivasan et al., Heterocycle–Activated Aromatic Nucleophilic Substitution of AB2 Poly(aryl ether phenylquinoxaline) Monomers. 3, Macromolecules 1996, 29, 8523–8545.

Y. Chujo, "Organic/Inorganic Polymer Hybrids", Polymer Materials Encyclopedia, vol. 6, 1996.

S. Srinivasan et al., "Heterocycle–Activated Aromatic Nucleophilic Substitution of AB2 Poly(aryl Ether Phenylquinoxalines) Monomers. 3", Research Report, Almaden Res. Ctr., San Jose, CA.

J. Frechet et al., "Synthesis and Properties of Dendrimers and Hyperbranched Polymers", Cornell University, Ithaca, NY, USA, IBM Almaden Research Center, San Jose, CA, USA.

L. Mascia, "Developments in Organic–Inorganic Polymeric Hybrids: Ceramers", TRIP vol. 3, Feb., 1995.

A. Morikawa et al., "Preparation of New Polyimide–Silica Hybrid Materials via the Sol–Gel Process", J. Mater. Chem., 1992, 2(7), 679–690.

T. Saegusa et al., "An Organic/Inorganic Hybrid Polymer", J. Macromol. Sci.–Chem., A27(13&14), pp. 1603–1612 (1990).

E. Babich et al., "Low Viscosity and High Temperature Stable Gap Filling Material for Glass/Ceramic substrates", IBM Technical Disclosure Bulletin, vol. 37, No. 07, Jul. 1994.

Y. Chujo et al., "Organic Polymer Hybrids with Silica Gel Formed by Means of the Sol–Gel Method", Advances in Polymer Science, vol. 100.

*Primary Examiner*—John Niebling
*Assistant Examiner*—Thomas G. Bilodeau
*Attorney, Agent, or Firm*—Robert B. Martin

[57] ABSTRACT

The invention relates to an integrated circuit device comprising (i) a substrate; (ii) metallic circuit lines positioned on the substrate and (iii) a dielectric material positioned on the circuit lines. The dielectric material comprises the reaction product of a hyperbranched polymer and organic polysilica.

8 Claims, 2 Drawing Sheets

5,767,014

1

INTEGRATED CIRCUIT AND PROCESS FOR ITS MANUFACTURE

FIELD OF THE INVENTION

The present invention relates to an integrated circuit comprising an improved dielectric material and process for manufacturing the integrated circuit.

BACKGROUND OF THE INVENTION

There is a continuing desire in the microelectronics industry to increase the circuit density in multilevel integrated circuit devices e.g., memory and logic chips thereby increasing their performance and reducing their cost. In order to accomplish this goal, there is a desire to reduce the minimum feature size on the chip e.g., circuit linewidth and also to decrease the dielectric constant of the interposed dielectric material to enable closer spacing of circuit lines without increase in crosstalk and capacitive coupling. Further, there is a desire to reduce the dielectric constant for the dielectric materials such as utilized in the back end of the line (BEOL) portion of integrated circuit devices, which contain input/output circuitry, to reduce the requisite drive current and power consumption for the device. The present dielectric is silicon dioxide which has a dielectric constant of about 4.0. This material has the requisite mechanical and thermal properties to withstand processing operations and thermal cycling associated with semiconductor manufacturing. However, it is desired that dielectric materials for future integrated circuit devices exhibit a lower dielectric constant (e.g.,<3.0) than exhibited by current silicon dioxide.

It is therefore an object of the present invention to provide an improved integrated circuit device comprising an improved dielectric material.

Other objects and advantages will be apparent from the following disclosure.

SUMMARY OF THE INVENTION

The present invention relates to an integrated circuit device comprising (i) a substrate; (ii) interconnecting metallic circuit lines positioned on the substrate and (iii) a dielectric material positioned contiguous to the circuit lines (over and/or between the circuit lines). The dielectric material comprises the reaction product of a hyperbranched polymer and organic polysilica. Preferably, the dielectric material has phase domains less than 1000 Å.

The present invention also relates to processes for forming the integrated circuit device of the present invention.

A more through disclosure of the present invention is presented in the detailed description which follows and from the accompanying drawings.

DETAILED DESCRIPTION OF THE INVENTION

Figure 1:
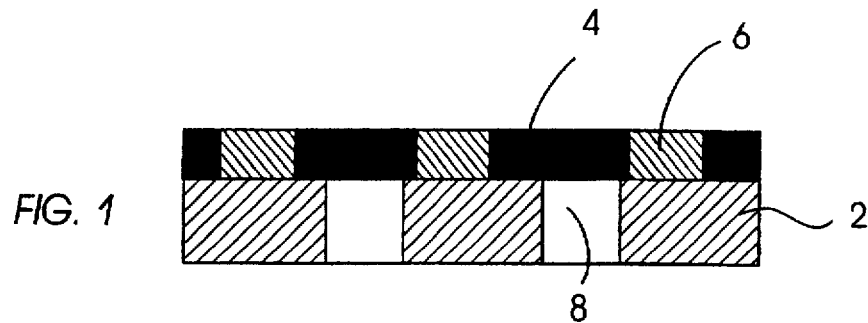
FIG. 1 is a cross-sectional view of a portion of the integrated circuit device of the present invention.

An embodiment of the integrated circuit device of the present invention is shown in FIG. 1. The device generally comprises substrate 2, metallic circuit lines 4 and dielectric

2 material 6. The substrate 2 has vertical metallic studs 8 formed therein. The interconnected circuit lines function to distribute electrical signals in the device and to provide power input to and signal output from the device. Suitable integrated circuit devices will generally comprise multiple layers of circuit lines which are interconnected by vertical metallic studs.

Suitable substrates for the device of the present invention comprises silicon, silicon dioxide, glass, silicon nitride, ceramics, aluminum, copper and gallium arsenide. Other suitable substrates will be known to those skilled in the art. In a multilayer integrated circuit device, an underlying layer of insulated, planarized circuit lines can also function as a substrate.

Suitable circuit lines generally comprise a metallic, electrically conductive, material such as copper, aluminum, tungsten, gold, silver, or alloys thereof Optionally, the circuit lines may be coated with a metallic liner such as a layer of nickel, tantalum or chromium or other layers such barrier or adhesion layers (e.g., SiN, TiN).

The key feature of the present invention is the dielectric material which is positioned over the circuit lines and/or between the circuit lines and on the substrate. In multilevel integrated circuit devices, the dielectric material is often planarized to function as a substrate for lithographic formation of the next layer of circuit lines. The dielectric material comprises the reaction product of an organic, hyperbranched polymer and organic polysilica.

Organic hyperbranched polymers are highly branched, three-dimensional, globular-shaped macromolecules which have reactive groups at the chain ends with a substantial number of reactive groups along the outer surface of the macromolecule. Hyperbranched polymers are formed by polycondensation of a multifunctional monomer $(A)_n RB$ wherein A is a coupling group which is reactive with B, R is a nonreactive organic spacer and $n>1$ preferably $n=2-5$ and more preferably $n=2-4$.

Suitably, the hyperbranched polymer is polydispersed in both molecular weight and branching. Hyperbranched polymers have low viscosity, high chemical reactivity and enhanced solubility even at higher molecular weights. Preferred hyperbranched polymers for use in the present invention have A and B groups independently selected from F, Cl, Br, CN, $—NH_2$, $—CO_2H$, $—CO_2R^1$, $—C(O)R^2$, OH, and $—NHC(O)R^3$ wherein $R_1$, $R_2$ and $R^3$ are each independently alkyl ($C_{1-6}$ alkyl) or aryl (e.g., phenyl or benzyl) and R is a spacer group selected from alkylene, aryl (e.g., phenyl) or heterocycle. The A and B reactive groups are selected so that they react only with each other. Preferred classes of hyperbranched polymers are hyperbranched poly(aryl ether phenylquinoxalines), poly(etherquinolines), poly(aryl esters), poly(ether ketones), poly(ether sulfones) polyphenylene, polyphenyleneoxide, polycarbonates and poly(etherimides). Suitable hyperbranched polymers for use in the present invention will be known to those skilled in the art such as disclosed in "Comprehensive Polymer Science", 2nd Supplement, Aggarwal, pages 71-132 (1996), the disclosure of which is incorporated herein by reference for all purposes.

Organic polysilica is a polymeric compound comprising silicon, carbon, oxygen and hydrogen atoms. Suitable organic polysilica include (i) partially condensed alkoxysilanes (e.g., partially condensed by controlled hydrolysis tetraethoxysilane having an Mn of about 500 to 20,000); (ii) organically modified silicates having the composition $RSiO_3$ and $R_2SiO_2$ wherein R is an organic substituent (iii)

partially condensed orthosilicates having the composition SiOR$_4$ and (iv) silsesquioxanes. Silsesquioxanes are polymeric silicate materials of the type RSiO$_{1.5}$, where R is an organic substituent.

Suitable organic polysilica for use in the present invention are known to those skilled in the art. Preferably, the organic polysilica is a silsesquioxone. Suitable silsesquioxane for the present invention is alkyl(methyl) phenyl silsesquioxane which are commercially available (e.g., GR950 from Techniglass Perrysburg, Ohio). Other suitable silsesquioxanes will be known to those skilled in the art such as disclosed in U.S. Pat. No. 5,384,376, and Chem. Rev. 95, 1409–1430 (1995), the disclosure of which are incorporated herein by reference for all purposes.

The dielectric composition is formed in a two step process. The first step involves dissolving the hyperbranched polymer and the organic polysilica in a suitable solvent (high boiling solvent e.g., N-methyl-2-pyrrolidone NMP) at room temperature. The solution is then heated to an elevated temperature directly or in a step wise fashion (e.g., 200° C. for 2 hrs. and then ramped up (5° C./min.) to 400° C. and held for 2 hrs.) to cause condensation of the organic polysilica and cross condensation with the reactive groups of the hyperbranched polymer.

The dielectric composition of the present invention has a dielectric constant less than 3.0 and preferably less than 2.9 at 25° C. The composition has phase domains less than 2000 Å microns, preferably less than 1000 Å microns, which result in enhanced mechanical toughness and crack resistance and isotropic optical properties and improved dielectric properties. Further the dielectric composition has mechanical properties that resist cracking and enable it to be chemically/mechanically planarized to facilitate lithographic formation of additional circuit levels in multilevel integrated circuit devices. The dielectric composition has increased breakdown voltage, enhanced toughness and increased crack resistance relative to polysilica, even in high ambient humidity with a thick film. The dielectric composition is optically clear and adheres well to itself and other substrate. The dielectric composition undergoes minimal shrinkage during heating. The composition of the present invention can also be utilized as a protective coating for optical articles such as glasses, contact lens and solar reflectors and other articles used in outer space.

Figure 2:
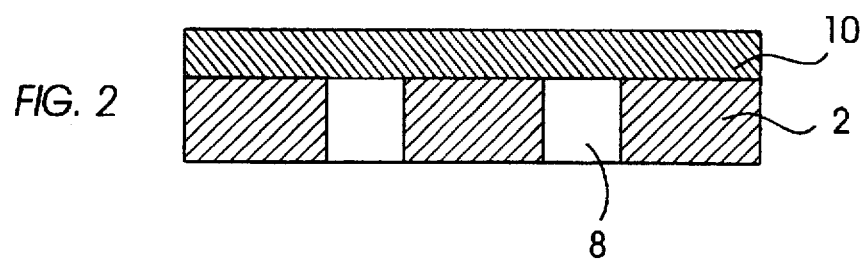
FIGS. 2-5 show a process for making the integrated circuit device of the present invention.

The present invention also relates to processes for manufacturing the integrated circuit device. Referring to FIG. 2, the first step of one process embodiment involves disposing on a substrate 2 a layer 10 of the dielectric composition of the present invention comprising organic polysilica and hyperbranched polymer. The substrate 2 is shown with vertical metallic studs 8. The composition is dissolved in a suitable solvent such as dimethyl propylene urea (DMPU), NMP or the like and is applied to the substrate by art known methods such as spin or spray coating or doctor blading. The second step of the process involves heating the composition to an elevated temperature to cross condense the polysilica silyl reactive groups with the reactive groups (e.g., hydroxy) on the hyperbranched polymer. Preferably, the composition is heated in the presence of a base such as an amine or Bronsted base. The base catalyzes both chain extension of the polysilica and cross condensation enabling a lower initial cure temperature. Suitably, the base is an organic amine. The amine will preferably have a high boiling point and is removable by heating upon completion of the reaction. A suitable base is N-methyldiethanolamine. Other suitable bases will be known to those skilled in the art such as disclosed in U.S. Pat. No. 5,206,117, the disclosure of which is incorporated herein by reference for all purposes.

Figure 3:
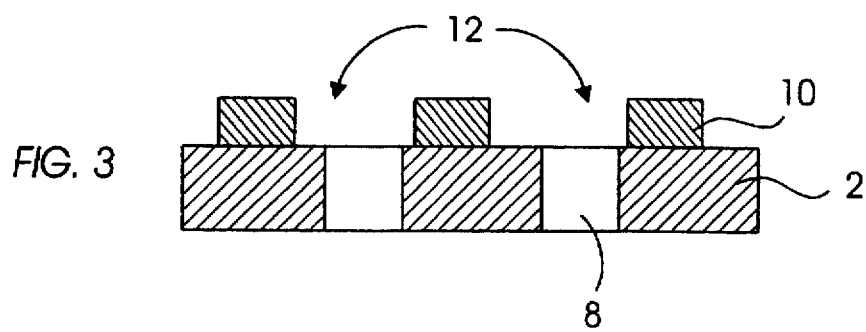

Referring to FIG. 3, the third step of the process involves lithographically patterning the layer 10 of dielectric composition to form trenches 12 (depressions) in the layer of composition. The trenches 12 shown in FIG. 3 extend to the substrate 2 and to the metallic stud 8. Lithographic patterning generally involves (i) coating the layer 10 of dielectric composition with a positive or negative photoresist such as those marketed by Shipley or Hoechst Celanese(AZ photoresist), (ii) imagewise exposing (through a mask) the photoresist to radiation such as electromagnetic e.g., visible UV or deep UV (iii) developing the image in the resist e.g., with suitable basic developer and (iv) transferring the image through the layer 10 of dielectric composition to the substrate 2 with suitable transfer technique such as reactive ion etching. (RIE) Suitable lithographic patterning techniques are well known to those skilled in the art such as disclosed in "Introduction to Microlithography", Thompson et al., (1994), the disclosure which is incorporated herein by reference for all purposes.

Figure 4:
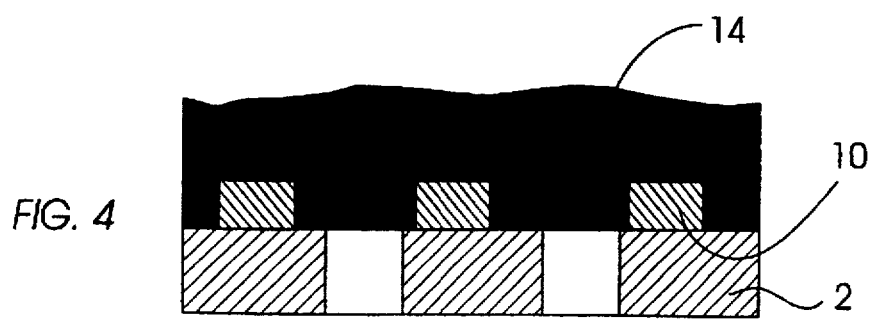

Referring to FIG. 4, in the fourth step of the process for forming the integrated circuit of the present invention, a metallic film 14 is deposited onto the patterned dielectric layer 10. Preferred metallic materials include copper, tungsten and aluminum. The metal is suitably deposited onto the patterned dielectric layer by art known techniques such as chemical vapor deposition (CVD), plasma enhanced CVD, electro and electroless deposition, sputtering or the like.

Figure 5:
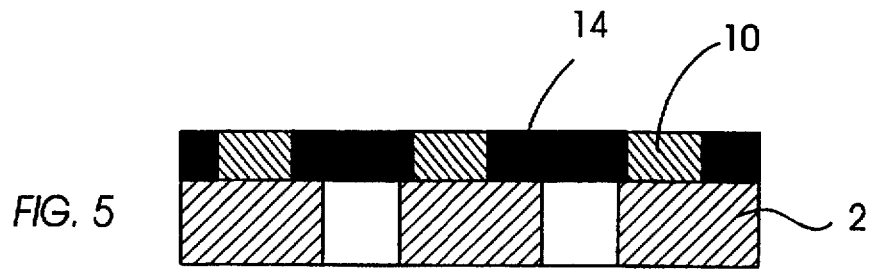

Referring to FIG. 5, the last step of the process involves removal of excess metallic material (e.g., planarizing the metallic film 14) so that film 14 is generally level with the patterned dielectric layer 10. Planarization can be accomplished using chemical/mechanical polishing or selective wet or dry etching. Suitable chemical/mechanical polishing techniques will be known to those skilled in the art.

Figure 6:
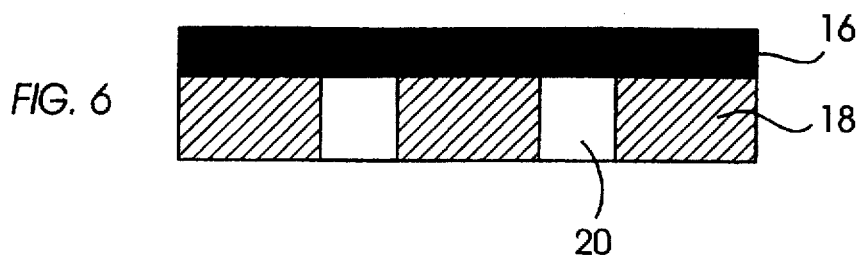
FIGS. 6-8 show an alternative process for making the integrated circuit device of the present invention.
Figure 7:
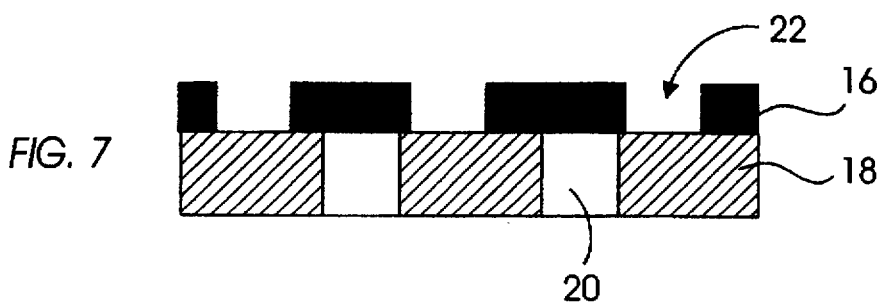
Figure 8:
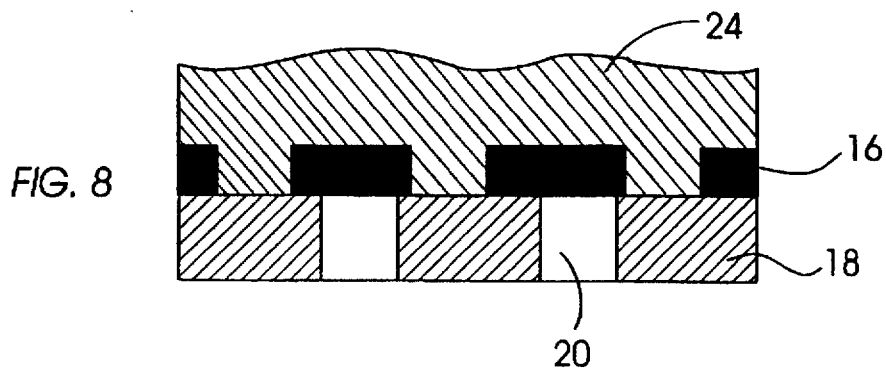

Referring FIGS. 6–8, there is shown an alternative embodiment of the process of the present invention for making the integrated circuit devices. The first step of the process in this embodiment involves depositing a metallic film 16 onto a substrate 18. Substrate 18 is also provided with vertical metallic studs 20. Referring to FIG. 7, in the second step of the process, the metallic film is lithographically patterned through a mask to form trenches 22. Referring to FIG. 8, in the third step of the process, a layer 24 of dielectric composition of the present invention is deposited onto the patterned metallic film 16. In the last step of the process, the composition is heated to condense the polysilica with the hyperbranched polymer. Optionally, the dielectric layer may then be planarized for subsequent process in a multilayer integrated circuit.

The following examples are detailed descriptions of the process of the present invention. The detailed preparations fall within the scope of, and serve to exemplify, the more generally described methods set forth above. The examples are presented for illustrative purposes only, and are not intended as a restriction on the scope of the invention.

EXAMPLE 1

2,3-bis(4'-hydroxyphenyl)-5-fluoroquinoxaline, 1

In a round-bottom flask equipped with a stirbar, reflux condenser and nitrogen inlet was placed 4,4'-bishydroxy benzil (24.80 g, 0.092 mol), 4-fluoro-1,2-phenylenediamine (11.60 g), 0.092 mol) and 300 mL of chloroform. The reaction mixture was heated to 50° C. and trifluoroacetic acid (0.2 mL) was added. The resulting dark solution was maintained at 50° C. for 24 h. The crude product was diluted with excess chloroform (300 mL), rinsed three times with dilute aqueous HCL to remove excess amine, dried (magnesium sulfate) and concentrated. The crude product was recrystallized from ethyl acetate/hexane to afford a yellow powder. The solution was subsequently cooled and filtered. Water was added dropwise to the filtrate with stirring and the precipitate was collected by suction filtration, washed well with water and air dried. The pure product (22 g, 93%) was obtained by recrystallization from isopropyl alcohol. (mp=121°–122° C.).

EXAMPLE 2

A. 4,4'-bis(4-methoxyphenoxy)benzil

To a 200 ml round-bottom flask equipped with a mechanical stirrer, a nitrogen inlet, a thermometer and a Dean-Stark trap fitted with a condenser and a nitrogen outlet were added 4,4'-difluorobenzil (50 mmol, 12.3 g), 4-methoxyphenol (110 mmol, 13.6 g) and anhydrous $K_2CO_3$ (70 mmol, 9.7 g). This was followed by the addition of 100 ml N,N-dimethylacetamide (DMAC) and 30 ml toluene as an azeotroping agent. The contents of the flask were maintained at 140°–150° C. for 2–4 h to allow for the complete removal of water from the system. The reaction temperature was further raised to 160° C. and allowed to proceed for a further 12–14 h. The solution was subsequently cooled and filtered. Water was added dropwise to the filtrate with stirring and the precipitate was collected by suction filtration, washed well with water and air dried. The pure product (22 g, 93%) was obtained by recrystallization from isopropyl alcohol. (mp= 121°–122° C.).

B. 4,4'-bis(4-hydroxyphenoxy)benzil

In a 250 ml round-bottom flask with a stirbar were placed 4,4'-bis(4-methoxyphenoxy)benzil (7.81 g, 20 mmol) and pyridine hydrochloride (13.87 g, 120 mmol). The mixture was heated under nitrogen in a 220° C. oil bath for 45 mins after which time deprotection was complete. The mixture was cooled to 80° C. and diluted to a volume of 250 ml by dropwise addition of water. The crude product was isolated by suction filtration, washed with water and then recrystallized from acetic acid to give the product (6.91 g, 81%). (mp=220°–221° C.).

C. 2,3-bis(4-hydroxyphenoxyphenyl)-5-fluoroquinoxaline, 2

In a 250 ml round-bottom flask equipped with a stirbar, reflux condenser and a nitrogen inlet was placed 4,4'-bis(4-hydroxyphenoxy)benzil (4.26 g, 10 mmol), 4-fluoro-1,2-phenylenediamine (1.36 g, 10 mmol) and acetic acid (75 ml). The resulting slurry was boiled for two hours and then cooled and the solid isolated by suction filtration, washed with acetic acid and air dried. The product was recrystallized from ethyl acetate to give a light yellow colored powder (80% yield). (mp 263–264.5).

EXAMPLE 3

Hyperbranched polyquinoxaline polymers

The self-polymerization of the quinoxaline monomers of Examples 1 and 2 was carried out in N-methyl and N-cyclohexyl pyrrolidinone NMP/CHP (50/50) mixture containing potassium carbonate. The potassium carbonate was used to convert the bisphenol into the more reactive bisphenoxide, and since potassium carbonate is a relatively weak and non-nucleophilic base, no hydrolytic side reactions with the 2,3-bis(4-fluorophenyl)quinoxalines were observed. Toluene was used during the initial stages of the polymerizations to remove water generated by bisphenoxide formation as an azeotrope with toluene. This solvent mixture gave a reflux temperature between 150 and 165° C. In an effort to maintain a dry system, the toluene was periodically removed through the Dean-Stark trap and replaced with deoxygenated dry toluene. Upon completion of bisphenoxide formation and dehydration, the polymerization mixtures were heated to 180°–220° C. to effect the displacement reaction. In each case, high molecular weight polymer was attained within 48 h as judged by the dramatic increase in viscosity. The polymers were isolated by precipitation into a 10-fold excess of methanol and boiled in water to remove the remaining salts.

The Tg of the resulting branched (poly(aryl ether phenylquinoxaline) was comparable to their linear analogues (190° C.). The poly(aryl ether phenylquinoxaline) was soluble in NMP. The resulting polymer was capable of film formation. Polymerization of monomer of Example 2 in NMP/CHP appeared to have limited solubility for the desired solids composition at 190° C. However, polymerization of the monomer of Example 2 in DMPU afforded more suitable polymer.

EXAMPLE 4

Dielectric Composition

The hyperbranched poly(aryl ether phenylquinoxaline) (0.15 g) of Example 3 and silsesquioxane GR950F (0.85 g) were dissolved in 1.4 mL of DMPU. Samples were cast and cured to 200° C. (2 h) then ramped (5° C./min) to 400° C. (2 h) to effect the condensation. Transparent, defect-free films were obtained (2–3 microns).

Although this invention has been described with respect to specific embodiments, the details thereof are not to be construed as limitations for it will be apparent that various embodiments, changes, and modifications may be resorted to without departing from the spirit and scope thereof, and it is understood that such equivalent embodiments are intended to be included within the scope of this invention.

What is claimed is:

1. A process for forming an integrated circuit comprising:
    (a) positioning on a substrate a layer of dielectric composition, the composition comprising reactants hyperbranched polymer and organic polysilica;
    (b) heating the composition to react the reactants;
    (c) lithographically patterning the dielectric layer;
    (d) depositing a metallic film onto the patterned dielectric layer; and
    (e) planarizing the film to form the integrated circuit.

2. The process of claim 1 wherein the hyperbranched polymer is poly(ether quinoline), poly (aryl ether phenylquinoxaline), poly(aryl ester) or poly(ether ketone).

3. The process of claim 2 wherein the organic polysilica is silsesquioxane.

4. The process of claim 3 wherein the silsesquioxane is phenyl/$C_{1-6}$ alkyl silsesquioxane.

5. A process for forming an integrated circuit comprising:
    (a) depositing a metallic film on a substrate;
    (b) lithographically patterning the metallic film;
    (c) depositing on the patterned metallic film, a layer of a dielectric composition comprising reactants hyperbranched polymers and organic polysilica; and
    (d) heating the composition to react the reactants.

6. The process of claim 5 wherein the hyperbranched polymer is poly(ether quinoline), poly(aryl ether phenylquinoxaline), poly(aryl ester) or poly(ether ketone).

7. The process of claim 6 wherein the organic polysilica is silsesquioxane.

8. The process of claim 7 wherein the silsesquioxane is phenyl/$C_{1-6}$ alkyl silsesquioxane.

\* \* \* \* \*